April 25, 1961 H. W. ABBOTT ET AL 2,981,881

SEMICONDUCTOR CIRCUITS

Filed Feb. 19, 1958 2 Sheets-Sheet 1

INVENTORS:
HAROLD W. ABBOTT,
LAWRENCE D. WECHSLER,

BY Walter C. Bernkopf

THEIR ATTORNEY.

April 25, 1961 H. W. ABBOTT ET AL 2,981,881

SEMICONDUCTOR CIRCUITS

Filed Feb. 19, 1958 2 Sheets-Sheet 2

INVENTORS:
HAROLD W. ABBOTT,
LAWRENCE D. WECHSLER,
BY Walter C. Bernkopf
THEIR ATTORNEY.

United States Patent Office 2,981,881

Patented Apr. 25, 1961

2,981,881

SEMICONDUCTOR CIRCUITS

Harold W. Abbott, Albany, and Lawrence D. Wechsler, Syracuse, N.Y., assignors to General Electric Company, a corporation of New York Filed Feb. 19, 1958, Ser. No. 716,210

9 Claims. (Cl. 330—10)

This invention relates to electrical circuits including semiconductor devices. More particularly, this invention relates to electrical circuits such as amplifiers or other wave modifying circuits utilizing a semiconductor storage diode as the active element thereof.

It is well known that semiconductor junction diodes, in addition to a barrier capacitance storage effect which is noticeable at extremely high frequencies, also exhibit another storage effect which determines their response at considerably lower frequencies if the diode is biased in the forward direction for a part of the cycle of an applied high frequency voltage. This latter storage effect consists of the temporary storage of injected excess minority carriers in the diode and is most pronounced where a periodically reversing voltage of high frequency is applied across the diode. Virtually any semiconductor diode of semiconductor material having a p-n junction therein will exhibit this storage effect to a certain degree depending upon the type of diode and the frequency at which it is operated. However, it is convenient to restrict the definition of the term "storage diode" to mean any diode having a characteristic such that when energized by a voltage varying in polarity at an appropriate frequency it will exhibit this storage effect to a substantial or useable degree. For a more complete discussion of the semiconductor physics involved in this storage effect, reference is made to an article by Robert H. Kingston and titled "Switching Time in Junction Diodes and Junction Transistors," appearing at pp. 829–834 of vol. 42 of the "Proceedings of the Institute of Radio Engineers" for May 1954, or to an article by R. G. Shulman and M. E. McMahon entitled "Recovery Currents in Germanium PN Junction Diodes" appearing at pp. 1267–1272 of vol. 24 of the "Journal of Applied Physics" for October 1953.

Semiconductor diode circuits utilizing this storage effect have been previously described in an article entitled "Diode Amplifiers" which appeared in the magazine "Electronic Design" at pp. 24 and 25 of the issue of October 1954, and additional improved circuits have been disclosed and claimed in the copending application Serial No. 716,194, of Harold W. Abbott and Lawrence D. Wechsler, filed concurrently herewith and assigned to the same assignee as the present application. The diode amplifier stages disclosed therein provide for voltage gain but no current gain and in general have the characteristics of common base transistor circuits, e.g. of providing no phase inversion between input and output signals and of providing an output impedance greater than the input impedance of the circuit.

The use of diode amplifiers has been limited by the fact that prior art diode amplifier stages have had a current gain less than unity. This has made it impossible in the past ot achieve storage diode circuit configurations having the characteristics of either common emitter or common collector transistor stages. Diode amplifier circuits having both a current and voltage gain and having characteristics of common emitter transistor stages, such as an input impedance which approximates the output impedance of the circuit have been disclosed and claimed in the copending application Serial No. 716,193, of Harold W. Abbott and Lawrence D. Wechsler, filed concurrently herewith and assigned to the same assignee as the present application. Diode amplifier circuits whose power gain is exclusively due to current gain including diode amplifiers having characteristics of common collector transistor circuits, have not previously been available.

It is therefore an object of this invention to provide diode amplifier circuits capable of providing power gain exclusively due to current gain.

It is a further object of this invention to provide diode amplifier circuits having an output impedance with a magnitude less than that of the input impedance so as to match a high impedance source to a low impedance load.

It is a further object of this invention to provide improved waveform modifying circuits such as amplifiers and modulators, which employ such diode amplifier stages.

Briefly, in accordance with one aspect of this invention, a semiconductor storage diode is serially connected to an electrical voltage supply source of predetermined frequency, hereafter termed the source, through a series impedance and a charge storage means such as a capacitor. It is a characteristic of a storage diode that upon application of a bipolar voltage waveform of equal cyclic periods, the magnitude of its forward current, i.e. the current when the diode is forwardly biased, exceeds the magnitude of its reverse current. Therefore when the source provides a bipolar signal having equal cyclic periods, the capacitor builds up a net charge which prevents forward conduction and thus reverse conduction of the storage diode. Under quiescent conditions, the series combination of the storage diode and capacitor thus represents a large impedance in respect to the series impedance so that an output taken across the storage diode and capacitance will substantially represent the source signal. If an input signal is applied from a circuit connected in parallel with the capacitor, the charge on the capacitor can be reduced so that the storage diode will conduct in the forward direction and by diode amplifier storage action will additionally conduct in the reverse direction. The diode impedance is thus lowered so that there is a substantial drop in voltage across the series combination of the storage diode and the capacitor. If an output load circuit is connected across this series combination, a substantial drop in output current can thus be obtained. The input signal must have a polarity opposing the charge on the capacitor and must supply an input current which is effectively additive to the diode reverse current flow so as to equalize the latter to the diode forward current. The magnitude of the required input current is small since it need merely approximate the difference between the normal forward and reverse currents of the diode. Current amplification is obtained because this small magnitude input current, by controlling both forward and reverse conduction through the storage diode, is capable of controlling a large magnitude output current.

While the specification concludes with claims particularly pointing out and distinctly claiming the invention, it is believed that the invention will be better understood if the following description is taken in connection with the accompanying drawings, in which:

Figure 1:
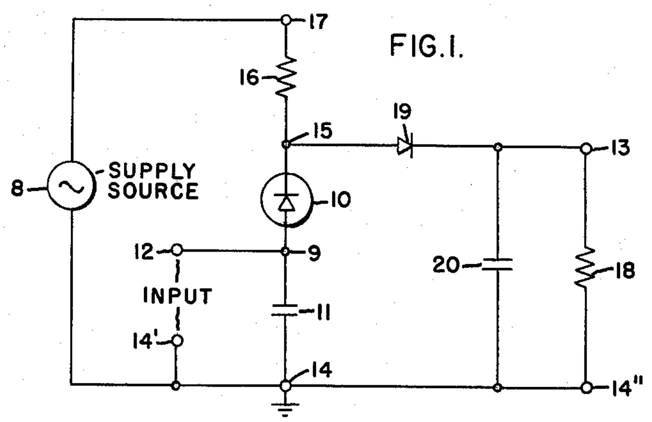
Fig. 1 is a schematic circuit diagram of one embodiment of a diode amplifier having current gain.

Referring now to Fig. 1, there is shown a diode amplifier circuit including a storage diode 10. In one particular embodiment of the invention, storage diode 10 was a General Electric type 1N93 diode. However, any suitable diode falling within the above definition of a storage diode may be used. The anode terminal 9 of diode 10 is connected to one side of capacitor 11 whose other side is connected to ground terminal 14. Input terminals 12 and 14' are connected to opposite sides of capacitor 11 and are adapted to be connected to an external input signal. The cathode terminal 15 of storage diode 10 is connected to a series impedance 16 whose other end is connected to terminal 17. A suitable voltage source 8 of suitable frequency is connected between terminals 14 and 17. The signal supplied by source 8 should have identically shaped positive and negative wave segments, but need not conform to any one specific wave shape although a signal of sinusoidal waveform was employed in one preferred embodiment of the invention. The frequency of the signal must be sufficiently high that the diode exhibits adequate storage characteristics but should be low enough so as to avoid the deleterious effect of barrier capacitance. The magnitude of capacitor 11 should be selected so as to provide a low reactance to the applied bipolar R.F. source signal and a high reactance to the input signal at terminals 12 and 14'. The circuit output is taken across the series combination of diode 10 and capacitor 11 and is supplied by terminals 14 and 15. In the preferred embodiment of the invention, the output signal is rectified and filtered by means of a conventional circuit, prior to application to the output load, represented by resistor 18, which is connected to output terminals 13 and 14''. A rectifying diode 19 is connected serially between terminals 15 and 13 and a filter capacitor 20 is connected in parallel across output terminals 13 and 14'', so as to parallel the output load. It must be understood that diode 19 and capacitor 20 only serve as a rectifying and filtering means and do not form an integral portion of the actual amplifying circuitry.

Figure 2:
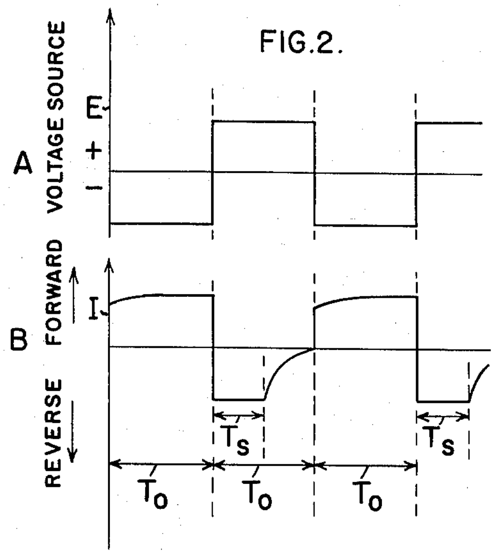
Fig. 2 is a waveform diagram illustrating the voltage and current relationship in a storage diode, with Fig. 2A illustrating the source voltage and Fig. 2B drawn on a common time scale, illustrating forward and reverse current through the diode.

The operation of the circuit of Fig. 1 may be more readily understood by an initial reference to basic storage diode operation. The storage phenomena, which forms the basis for diode amplifier circuitry, is well known. When a storage diode is biased in the forward direction so that current flow takes place through the diode, there is a reduction in the space charge, which normally restricts all electron and hole travel across the junction. This reduction of the barrier permits holes to flow into the N region and electrons to flow into the P region of the diode. If the voltage applied to the diode is quickly switched from the forward to the reverse bias voltage, an initially large reverse current flows for a time as a result of the return flow of the previously injected minority carriers. Fig. 2 graphically illustrates the current flow through a storage diode, connected through a current limiting impedance to a voltage source, during the application of successive forward and reverse bias voltages. It is assumed that the bipolar source signal applied to the storage diode consists of a square wave having positive and negative cycles of equal time duration, indicated in Fig. 2A as $T_0$, and of equal and opposite amplitude. Fig. 2B illustrates that a substantially constant amplitude current flows through the diode while it is biased in the forward direction, but further illustrates that the reverse current amplitude is constant only for a time period indicated as $T_s$. Subsequent to this time period the reverse current decays in amplitude. The time period $T_s$ is less than the period during which the storage diode is reverse biased, because the quantity of stored carriers is insufficient to sustain a reverse current of longer duration. The quantity of stored carriers is limited by the capability of the diode to store charges corresponding to the entire forward current, and additionally by the recombination of stored charges with the majority carriers prior to expiration of the reverse current. It can thus be seen that the average forward current exceeds the average reverse current. Referring again to Fig. 1, it may be seen that, because of the negative potential applied by source 8 to terminal 17 during diode forward conduction, a net charge will build up on capacitor 11 so that a negative potential appears at the anode terminal 9 of storage diode 10 which cuts off conduction of the device in the forward direction. When diode 10 is biased to cut off, there can be no stored carriers and there can be no conduction in the reverse direction. Under quiescent conditions, the series circuit comprising capacitor 11 and diode 10 therefore has a very high impedance in respect to series impedance 16, and substantially the entire source signal is applied between terminals 14 and 15.

Figure 3:
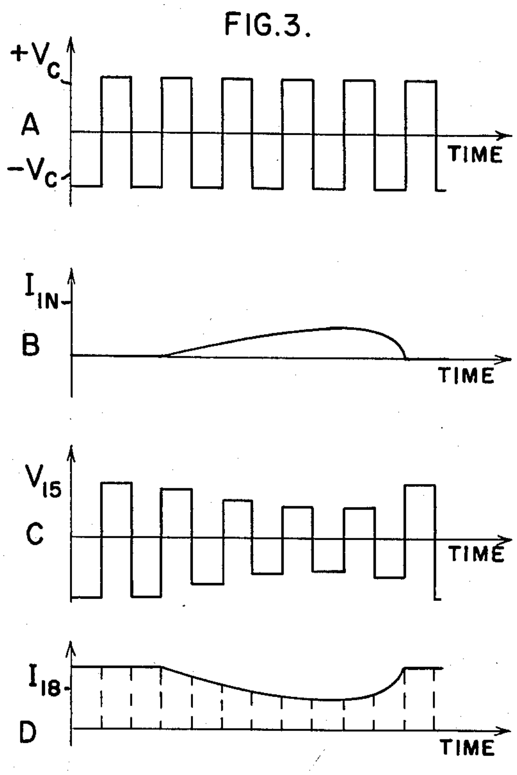
Fig. 3 is a group of waveform diagrams drawn on a common time scale illustrating the relationships between the source voltage, the input current signal, and the output signals.

If an input signal is applied to terminals 12 and 14' so as to effectively neutralize the negative charge on capacitor 11, then the diode will be permitted to conduct in the forward and reverse directions. This requires an input current which aids the reverse current flow and has a magnitude approximating the difference between the average forward and reverse current of the diode. This difference varies with different diodes, and obviously diodes having the smallest difference provide maximum amplification. The quality of a storage diode is generally expressed in terms of its current gain, which is the ratio of average reverse current to average forward current. The amplification effect of an input signal applied between terminals 12 and 14' is illustrated in Fig. 3. From Fig. 3C which illustrates the amplifier circuit output voltage at terminal 15 it may be seen that with no applied input signal between terminal 12 and 14', the output voltage corresponds closely to the voltage amplitude of the source signal, as shown in Fig. 3A. The subsequent gradual increase of input current, as shown in Fig. 3B, results in a corresponding increase of diode forward, and thus reverse, conduction with an associated reduction of peak voltage amplitude of the bipolar signal at cathode terminal 15. As is shown in Fig. 3C, the envelope amplitude of the bipolar voltage waveform at terminal 15 varies inversely with the amplitude of the input current. The load current through load resistance 18, proportional in amplitude to the voltage at terminal 15, is rectified by diode 19 and filtered by capacitance 20. The solid line of Fig. 3D illustrates that the load current, i.e. output current, is an amplified but inverted image of the input current. It should of course be understood that a bipolar input signal as well as a unipolar signal may be amplified by proper biasing of the input signal applied to terminals 12 and 14'.

It should be noted here that it has been found desirable to limit the maximum frequency of the input signal to one-tenth of the frequency of the source signal applied across the storage diode. This permits selection of the magnitude of capacitor 11, so that it provides a low reactance to the source signal but a high reactance to the input signal.

In one satisfactorily operating circuit, the following parameters were utilized; but it should be noted that these are exemplary and should not be considered as limiting the scope of the invention:

| | |
|---|---|
| Storage diode 10 | General Electric type 1N93. |
| Diode rectifier 19 | General Electric type 1N69. |
| Series impedance 16 | 5100 ohm resistor. |
| Capacitance 11 | .01 mfd. |
| Load resistance 18 | 1,000 ohms. |
| R.F. power source frequency | 1 megacycle. |
| R.F. power source voltage | ±6 volts. |
| Input current | .04 miliamperes. |
| Output current | .28 miliamperes. |

Figure 4:
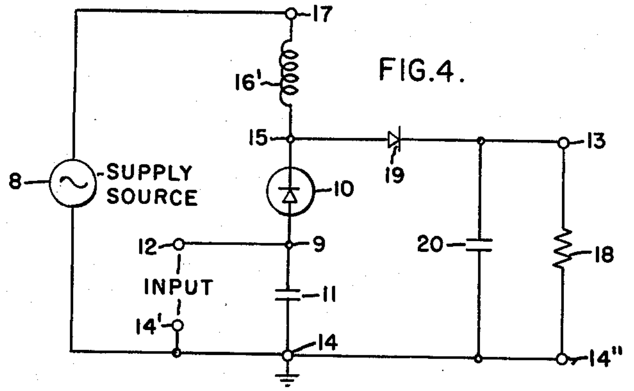
Fig. 4 is a schematic circuit diagram of another embodiment of the diode amplifier.

The circuit of Fig. 1 may be slightly modified by utilizing an inductance as the series impedance 16, as shown in Fig. 4. The corresponding elements, of Fig. 3, have already been described in connection with Fig. 1 and are identified by the same reference character. The use of inductance 16′ in lieu of a resistance reduces considerably the power dissipation within the circuit. The utilization of an inductance is made possible in this circuit configuration since the current through series impedance 16 is approximately equal both in the forward and reverse directions, irrespective of the applied input signal and thus the degree of storage. It should be noted also that the amplifiers of Fig. 1 and Fig. 4 have an input impedance substantially higher than that of the output impedance, while the input and output voltage levels are essentially equal. This permits the cascading of amplifier stages with optimum power matching from a high impedance source to a low impedance load. Such cascaded circuitry has been successfully employed as an audio frequency amplifier.

Figure 5:
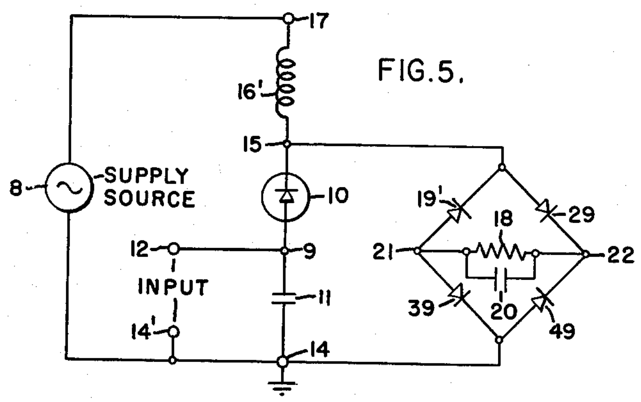
Fig. 5 is a schematic circuit diagram of another embodiment of the diode amplifier suitable of supplying a high power output.

The circuit of Fig. 1 may be further modified as shown in Fig. 5, in which the amplifier output signal appearing between terminals 14 and 15 is rectified by a full wave rectifier, comprising rectifiers 19′, 29, 39, and 49 in a bridge circuit with the load impedance 18 and parallel filter capacitor 20 being connected across the opposite output terminals 21 and 22 of the bridge. Full wave rectification, resulting in a considerable increase in output signal power, is made possible since the signal appearing at terminal 15 has no D.C. component.

Figure 6:
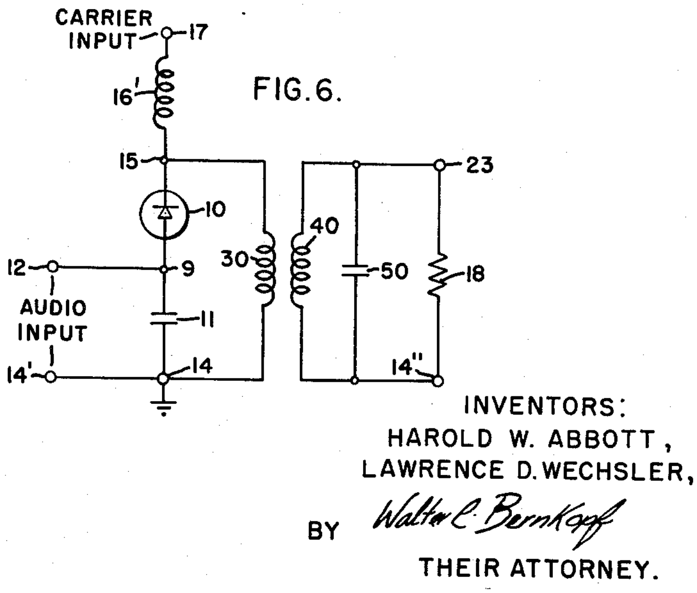
Fig. 6 is a schematic circuit diagram of an amplitude modulator utilizing a disclosed form of diode amplifier circuitry.

The disclosed diode amplifier circuit may additionally be modified so as to serve as an amplitude modulator, as shown in Fig. 6, which has substantially improved characteristics over conventional diode modulators. The carrier input is applied between terminals 14 and 17, and the audio input signal is applied between terminals 12 and 14′. The output appearing between terminals 14 and 15 is coupled to the primary winding 30 of a transformer whose secondary winding 40 in conjunction with parallelly connected capacitor 50 constitutes a circuit tuned to the carrier frequency. The modulated carrier frequency is connected from the end terminals 14″ and 23 of secondary winding 40 to the load represented by impedance 18. The principal advantage of this type of arrangement arises from the audio power gain which is inherent in its operation. In this case power gain defined as the ratio of sideband power at the output to audio power at the input is in one operative circuit in the order of 8 db.

While the principles of the invention have now been made clear, there will be immediately obvious to those skilled in the art many modifications in structure, arrangement, and proportions of the elements and components used in the practice of the invention, and otherwise, which are particularly adapted for specific environments in operating requirements without departing from those principles. Thus it will be readily possible to utilize the current gain amplification scheme disclosed by the applicant in a variety of additional circuits. The appended claims are, therefore, intended to cover and embrace any such modifications within the limits only of the true spirit and scope of the invention.

What we claim as new and desire to secure by Letters Patent of the United States is:

1. An electrical circuit comprising: a voltage source and an impedance, a storage diode and a charge storage means in series connection; said voltage source being adapted to provide a source signal of predetermined frequency having cycles of consecutive first and second substantially identical waveform segments of opposing polarity; said storage diode and said predetermined frequency being selected so that a forward current is passed when forwardly biased by the first waveform segment of the source signal and a substantial reverse current is passed, by virtue of the diode minority carrier storage effect, when reversely biased by the second waveform segment of the source, said forward current exceeding said reverse current, whereby there is a diode net current in the forward current direction during each cycle of the source signal; said charge storage means, being constructed to store said diode net current so as to bias said diode and prevent diode conduction, input means coupled to said charge storage means, for coupling in an input signal current poled to reduce the bias at said storage means thereby to control current flow through said diode and output means coupled across said storage diode and said storage means for detecting voltage fluctuations at said predetermined frequency across said storage diode and said storage means for deriving a current signal which is a function of said input signal.

2. An electrical circuit comprising: a voltage source and an impedance, a storage diode and a charge storage means in series connection; said voltage source being adapted to provide a source signal of predetermined frequency having cycles of consecutive first and second substantially identical waveform segments of opposing polarity; said storage diode and said predetermined frequency being selected so as to provide a forward current when forwardly biased by the first waveform segment of the source signal and to pass a substantial reverse current, by virtue of the diode minority carrier storage effect, when reversely biased by the second waveform segment of the source, said forward current exceeding said reverse current, whereby there is a diode net current in the forward current direction during each cycle of the source signal; and said charge storage means, connected to said storage diode, being constructed to store said diode net current so as to bias said diode and prevent diode conduction, input means coupled to said charge storage means and adapted to apply an input signal current poled to reduce the bias at said storage means so as to control current flow through said diode; and output means coupled across said storage diode and said charge storage means for detecting voltage fuctuations at said predetermined frequency appearing across said storage diode and said storage means for deriving a current signal which is an amplified function of said input signal.

3. Apparatus as in claim 2 wherein said impedance is a resistor.

4. An electrical circuit comprising: a series circuit including an impedance, a storage diode and charge storage means; said series circuit being adapted to be connected to a voltage source being adapted to provide a source signal of predetermined frequency having cycles of consecutive first and second substantially identical waveform segments of opposing polarity; said storage diode and said frequency being selected so as to provide a forward current when forwardly biased by the first waveform segment of the source signal and to pass a substantial reverse current, by virtue of the diode minority carrier storage effect, when reversely biased by the second waveform segment of the source, said forward current exceeding said reverse current, whereby there is a diode net current in the forward current direction during each cycle of the source signal; and said charge storage means, connected to said storage diode, being constructed to store said diode net current so as to bias said diode and prevent diode conduction; input means parallelly coupled across said charge storage means adapted to apply an input current signal, said input current signal by varying the bias at said storage means controlling current flow through said diode, output means coupled across said diode and said storage means for deriving voltage fluctuations at said predetermined frequency appearing across said storage diode and said storage means for providing a signal having the predetermined frequency of the source and an amplitude inversely proportional to said input signal.

5. Apparatus as in claim 4 wherein said output means comprise coupling means and resonant circuit means, said coupling means having input and output terminals, said input terminals being connected across said diode and said charge storage means and said output terminals, adapted for connection to a load, being connected with said resonant circuit means so as to form a parallel resonant circuit tuned to the predetermined frequency of said source signal.

6. An electrical circuit comprising a series circuit including an impedance, a storage diode and a capacitor; said series circuit being adapted to be connected to a voltage source providing a source signal of predetermined frequency having cycles of consecutive first and second substantially identical waveform segments of opposing polarity, said storage diode and said predetermined frequency being selected so as to pass a forward current when forwardly biased by the first waveform segment of the source signal and to pass a substantial reverse current, by virtue of the diode minority carrier storage effect, when reversely biased by the second waveform segment fo the source, said forward current exceeding said reverse current, whereby there is a diode net current in the forward current direction during each cycle of the source signal; and said capacitor being connected to said storage diode to store said diode net current so as to bias said diode and prevent diode conduction; input means parallelly couple across said capacitor being adapted to apply an input current signal having a frequency below that of the source signal frequency poled to reduce said bias, output means for deriving voltage fluctuations at said predetermined frequency coupled across said diode and capacitor, said output means including rectifying means and filtering means, said means being adapted for connection to a load impedance so as to provide a current output signal which is an amplified and phase inverted reproduction of an input current signal applied to said input means.

7. Apparatus as in claim 6 in which said rectifying means comprises a full wave rectifier.

8. A diode amplifier circuit comprising a series circuit adapted to be connected to a voltage source of predetermined frequency having substantially identical waveform segments of opposite polarity during alternate periods of a waveform cycle; said series circuit comprising a storage diode selected to provide both a forward and a substantial reverse current when energized at said predetermined frequency having two terminals and an impedance, said impedance being connected to one of said terminals of said storage diode, and a capacitor, said capacitor having two terminals, one of said capacitor terminals being connected to the other terminal of said storage diode; a first input terminal being connected to the junction of said diode and one terminal of said capacitor, and a second input terminal being connected to the other terminal of said capacitor, said input terminals being adapted for connection to an input current source poled with respect to said diode to reduce the charge normally arising during energization by said source of predetermined frequency; and a rectifier having one terminal connected to the junction of said diode and said impedance and the other terminal connected to a first output terminal, a second output terminal being connected from said other terminal of said capacitor, said first and second output terminals being adapted to be connected to a load thereby to provide an output current signal which is a function of said input signal.

9. Apparatus as in claim 8 having filter means resonant to said predetremined source frequency connected across said output terminals.

References Cited in the file of this patent

UNITED STATES PATENTS

| | | |
|---|---|---|
| 2,666,816 | Hunter | Jan. 19, 1954 |
| 2,823,321 | Sims | Feb. 11, 1958 |
| 2,835,747 | Cluwen | May 20, 1958 |
| 2,879,409 | Holt | Mar. 24, 1959 |
| 2,917,717 | Thorsen | Dec. 15, 1959 |